United States Patent [19]

Pricenski et al.

[11] Patent Number: 4,482,799

[45] Date of Patent: Nov. 13, 1984

[54] EVAPORATION HEATER

[75] Inventors: Theodore J. Pricenski, Ipswich; Edward D. Parent, Hamilton, both of Mass.

[73] Assignee: GTE Products Corporation, Stamford, Conn.

[21] Appl. No.: 268,028

[22] Filed: May 28, 1981

[51] Int. Cl.³ .............................................. F22B 1/28
[52] U.S. Cl. ................................. 219/275; 219/271; 219/385; 219/424; 219/521; 118/726
[58] Field of Search .............................. 219/271–276, 219/385, 420, 424, 426, 521, 553; 118/726, 727, 50.1, 620, 641

[56] References Cited

U.S. PATENT DOCUMENTS 1,944,821  1/1934  Blaise ................................. 219/274
2,772,318  11/1956  Holland ............................. 219/275
3,486,001  12/1969  Czarnowski ...................... 219/271

FOREIGN PATENT DOCUMENTS 1298834  7/1969  Fed. Rep. of Germany ...... 219/275
493249  4/1954  Italy ................................... 219/271

OTHER PUBLICATIONS

Wald, G., "Evaporation Apparatus", IBM Technical Disclosure Bulletin, vol. 14, No. 9, Feb. 1972, pp. 2548–2549.

Beaudouin, P. L., "Long Life Chromium Evaporation Source", IBM Technical Disclosure Bulletin, vol. 14, No. 3, Aug. 1971, p. 740.

Primary Examiner—B. A. Reynolds
Assistant Examiner—Teresa J. Walberg
Attorney, Agent, or Firm—Edward J. Coleman

[57] ABSTRACT

An evaporation heater having a wire wound into a coil and a support wire which extends from one arm of the wire outside of the coil, in spaced proximity therewith, to a central position within the coil but out of electric contact therewith is disclosed. An annular pellet of evaporant material is positioned over the wire support arm within the heater coil but out of contact therewith.

The atmosphere around the heater coil and pellet is substantially evacuated and current is directed through such coil to apply radiant heat to the pellet to evaporate same.

Because the heater coil is in spaced proximity with the pellet of evaporant material and not in contact therewith, chemical reaction therebetween or erosion is avoided, and a durable evaporation heater of uncomplex construction is provided.

12 Claims, 4 Drawing Figures

EVAPORATION HEATER

BACKGROUND OF THE INVENTION

This invention relates to heating evaporant material, particularly a method and apparatus for applying radiant heat to such material.

Evaporation heaters for sublimable material have been formed from sheet refractory metal such as tantalum, in the form of a resistively heated box, see for example U.S. Pat. No. 3,598,958 to Davey et al. (1971). The drawback of such heaters is that they are relatively expensive, require considerable electric power and often chemically react with the evaporant being heated causing erosion and failure of the heater.

Another type of evaporation heater employs a coiled tungsten heater mounted within an annular chamber, the evaporant material being placed in an annulus around such heater; e.g., a shown in U.S. Pat. No. 4,002,880 to Davey et al. (1977). This type of heater is employed for relatively large amounts of evaporant or large sized annular evaporant bodies and is not efficient for evaporating smaller sized evaporant including pellets. Further the heater applies heat from but one side of the material, the inside. In addition such heaters have a considerable number of component parts and are of sizable construction.

Evaporation heaters of simpler construction have been proposed such as wire coil heaters, e.g. U.S. Pat. Nos. 2,301,456 to Sabine (1942) and 4,054,500 to Parent (1977). In the former coil type heater patent, the evaporant material, e.g., a pellet, is placed in direct contact with the heater coils which subjects such heater to chemical reaction, erosion and failure. In the latter type of coil, which is coated with alumina to form a crucible, such protective coating delays but does not prevent the resultant erosion and failure of this type of heater.

Accordingly, an evaporation heater which is of uncomplex construction and avoids the chemical reactive and erosion problems discussed above had heretofore not been available, and there is a need and market for such improved heater which substantially overcomes the above prior art shortcomings.

SUMMARY OF THE INVENTION

Accordingly, it is an object of this invention to provide an evaporant heater which applies radiant heat to evaporant material while minimizing or avoiding a chemical reaction therewith.

It is a further object of the invention to provide an evaporant heater in which the evaporant material is supported in spaced proximity with the heating element of said heater.

These and other objects, advantages and features are achieved in accordance with the invention which provides, an apparatus for heating evaporant material comprising a conductive, annular, heating element having a plurality of conductors mounted thereto. A material holder includes a support arm mounted to one of the conductors outside of the annular heating element, which arm extends proximate the interior of the annular heating element. The material holder is mounted on the apparatus for holding the material in spaced proximity with the interior of the heating element so that energization of the heating element by the application of electric current therethrough is operative to radiantly heat the evaporant material.

BRIEF DESCRIPTION OF THE DRAWING

The invention is further disclosed in the following detailed specification and drawings in which.

DESCRIPTION OF PREFERRED EMBODIMENT

Figure 1:
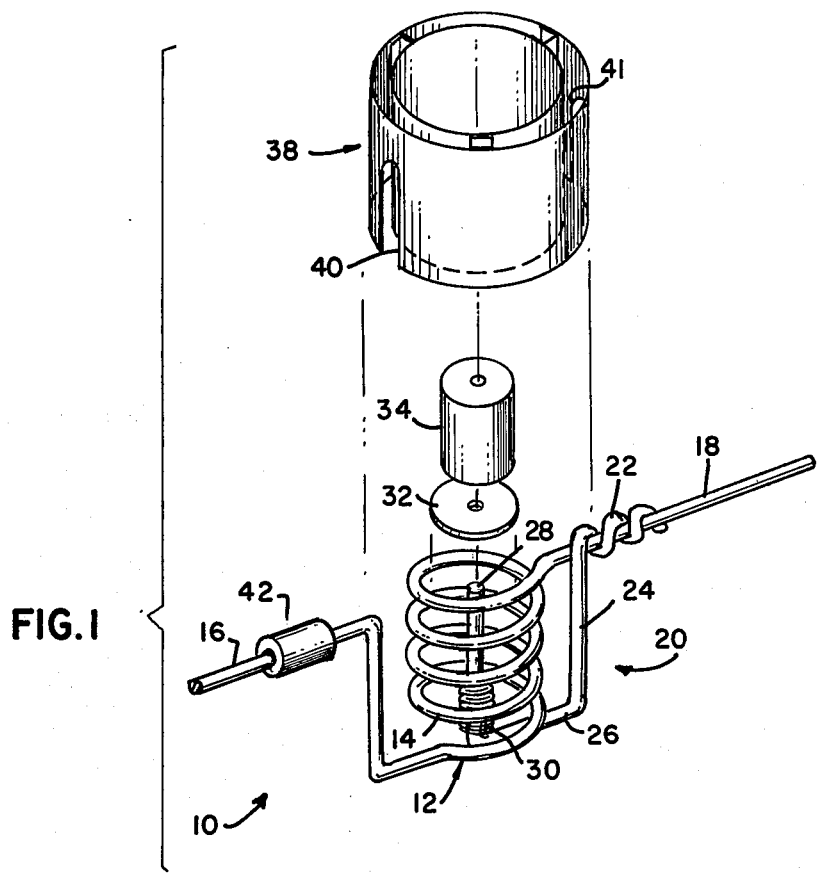
FIG. 1 is an exploded perspective view of the evaporant heater embodying the present invention.
Figure 2:
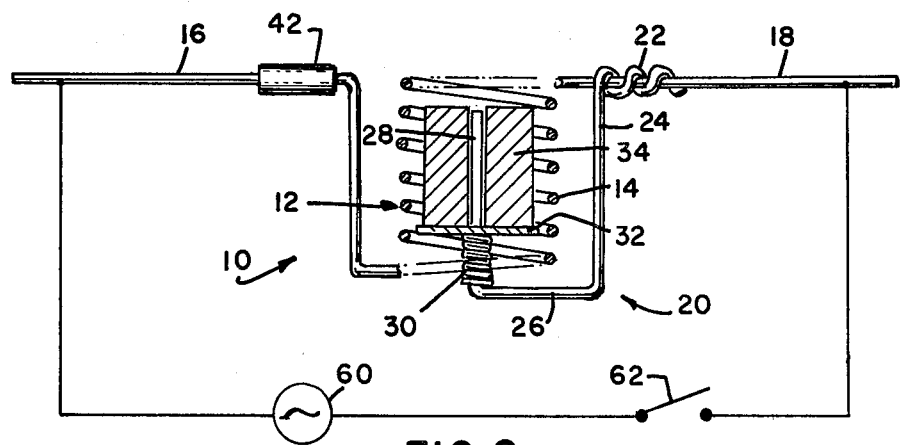
FIG. 2 is a sectional elevational view of the evaporant heater of FIG. 1, excluding the heat shield, with a typical power source shown schematically.

Referring in more detail to the drawing, the evaporant heater 10 has as a heating element, an electrical tungsten heater coil 12 having turns 14 and arms 16 and 18, as shown in FIGS. 1 and 2. Mounted to the coil arm 18 is a wire support arm 20, which is secured by wire turns 22 around the coil arm 18, which arm extends in a first segment 24 and bends to define a second segment 26, proximate the outside of the coil 12, which arm bends to define a third segment 28, which extends into the coil 12 in spaced proximity with such coil 12 and preferably coaxially therewith as shown in FIGS. 1 and 2. Of course, since segment 28 of the wire support arm 20 is open-ended, it is non-current carrying when the heater coil is electrically energized. Advantageously, a spacer sleeve, e.g. a minor coil 30, is positioned over the support arm segment 26, as shown in FIGS. 1 and 2. Advantageously but also not necessarily, an annular spacer, e.g. annular washer 32, fits over the support arm segment 28, atop the minor coil 30, as shown in FIG. 2. Evaporant material in the form of an annular pellet 34, is positioned over the support arm segment 28, atop the spacer sleeve or minor coil 30, as indicated in FIG. 1 and atop the annular washer 32 and minor coil 30, as shown in FIG. 2 within the heater basket or coil 12 as indicated or shown in FIGS. 1 and 2, respectively. The annular washer 32 serves to hold fragments of the pellets 34 in position within the heater coil 12 as indicated in FIG. 2.

Figure 3:
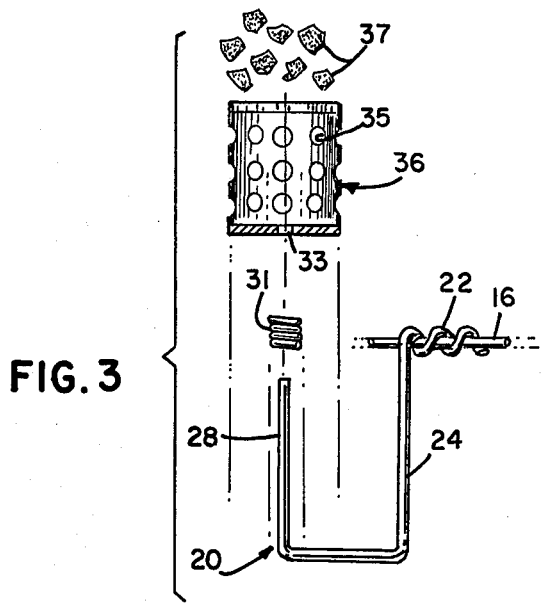
FIG. 3 is an exploded elevational view of an alternative component, shown in section, of the evaporant heater embodying the present invention.

Alternatively, in place of the annular pellet 34 and the annular washer 32, an annular apertured container 36 of refractory (shown in axial vertical section) material, having a bottom with arm receiving aperture 33 and side with apertures 35, can be positioned over and around the segment 28 of the support arm 20, atop a spacer sleeve such as minor coil 31, as indicated in FIG. 3. Such apertured container 36 is accordingly positioned within the heating coil in the same manner as the pellet 34 of evaporant material, as discussed above and as indicated in FIG. 2. In place of the pellet 34, various sized fragments or pieces of evaporant material 37 are placed in the apertured container 36, as indicated in FIG. 3, for evaporation heating in the manner discussed above.

Advantageously, before the current is applied to the heating coil 12 from a suitable power source (e.g. an AC source 60 with switch 62 is shown schematically in FIG. 2), a heat shield 38, having arm slots 40 and 41, which slots fit over the coil arms 16 and 18, is lowered over the heating coil 12 and the within evaporant material, as indicated in FIG. 1. Also, an insulating sleeve 42, e.g., of alumina, is positioned on the coil arm 16, in alignment with the heat shield slot 40, as shown in FIG.

1; in this manner the heat shield 38 is insulated on one side and, thus, is an open ended conductor.

A current is then directed through the coil 12 and radiant heat applied to the evaporant material. Advantageously, evacuating means (not shown) apply a vacuum to the evaporation heater 10, e.g. shown in FIG. 1, to augment the evaporation process.

Figure 4:
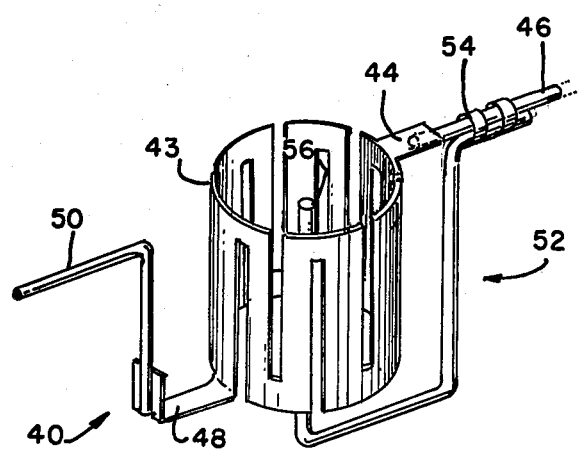
FIG. 4 is a perspective view of another evaporant heater embodying the invention.

In another embodiment of the invention, the heater 10 of FIG. 1 is replaced by a heater 40, shown in FIG. 4, which has as an annular heating element, a sleeve 43 of conductive material e.g. metal such as tungsten, tab 44 connected to conductor 46 and tab 48 connected to conductor 50, such as by welding. A support arm 52 mounted to conductor 46 by bands 54, has evaporant material support segment 56, as shown in FIG. 4. Sleeve 43 perferably is slotted, as shown, to form a meandering strip heater (i.e. zig-zag element).

The evaporation heater embodying the invention provides an annular heating element and a non-current carrying support arm of uncomplicated construction, which avoids physical contact between the evaporant material and the heating element, which element provides radiant heat to the evaporant material. Since the evaporant heater embodying the invention is constructed to prevent contact between the evaporant material and the heating element, a chemical reaction causing erosion or demise of such heating element is hindered or prevented.

The evaporant heating element of the invention can be a flat, angular, curved or annular member or combination thereof, provided the evaporant material is supported in spaced proximity therewith within the scope of the invention. Preferably the heating element of the invention is a conductive annular member, having a continuous or apertured surface or combination thereof. For example, the annular heating element can be sleeve of metal e.g. tungsten with conductive leads attached thereto, e.g. as shown in FIG. 4. Preferably, however, the annular heating element is defined by a wire woven or wound into a basket or coil, especially a helical coil. More preferred is a wire wound into a helical coil wherein the coils are of substantially uniform diameter, e.g. as shown in FIG. 1, so as to apply relatively uniform radiant heat to the evaporant material positioned in spaced proximity therewith.

The holder arm can be attached to an arm or other portion of the heater by a series of turns, e.g., turns 22, as shown in FIG. 1 or by welding e.g., a platinum weld or by clamping thereto or other suitable means within the scope of the invention.

The evaporation heating element of the invention can be made of various conductive materials, including metals e.g. tungsten or of various conductive filaments including metal wire, and preferably, tungsten wire. The holder arm can be made of the same filament material as the heater or a filament of non-conductive material can be employed. Preferably the holder arm is also formed of tungsten wire.

The holder arm can take various shapes including angular, curved or a combination thereof provided it holds the evaporant material in spaced proximity with the heater of the invention. The holder arm supports the evaporant material relative to the axis of the annular heating element, i.e., proximate such axis or (preferably), coaxially therewith as desired, in the scope of the invention.

Advantageously, a spacer is employed on the holder arm, as discussed above, to locate the evaporant material at a desired position relative to the heater embodying the invention. Such position can be, in the case of an annular heater in spaced proximity therewith within or without or partially within such heater, and preferably is within such annular heater e.g. as shown in FIG. 2. The spacer can be of any conductive or non-conductive heat resistant material, e.g. an alumina tube or can be a minor coil of such materials e.g. of tungsten.

The annular member which fits around the support arm, atop the spacer member, can be of various heat resistant materials, conductive or non-conductive and preferably is an annular washer of refractory metal. As indicated, the annular member serves to hold particles of evaporant material in a desired location in spaced proximity with the heating element of the invention, i.e., in the desired heating zone. The above described spacer member and/or the annular member can be omitted, if desired, within the scope of the present invention.

The evaporant material can be various materials, including sublimable materials which includes, SiO, ZnS, CdS, TiO, and Cr. Of course, various other evaporant materials can be employed in the evaporation heater of the present invention. Such evaporant materials can be in powder, particle, or pellet form as desired. If an annular pellet, it is readily inserted on the holder arm, e.g. as indicated in FIGS. 1 and 2, with or without an annular member or spacer and preferably with both, as shown in FIG. 2. If particles or powder, such material is desirably placed in an apertured container, e.g. as shown in FIG. 3.

The apertured container is preferably of refractory metal, can take virtually any shape, rounded, angular, or a combination thereof, be partly apertured and partly continuous or predominantly apertured e.g. a wire basket.

It should be noted that the pellet of evaporant material need not be apertured nor need the container for evaporant material be apertured in the bottom surface, provided the holder arm either terminates in a support surface for pellet or container or such holder arm terminates inside or proximate the spacer or proximate the annular member to provide such support surface. Preferably however, the support arm does extend into the evaporant material, as discussed above.

An advantage of the present invention is that small pellets or particles of evaporant material can be heated and evaporated, e.g. for vapor deposition thereof. The amount of current applied to bring the evaporation heater of the invention to a desired temperature is related to the applied chamber pressure, including reduced pressure and the nature of the material being evaporated as illustrated in the following example.

The following example is intended to illustrate the invention and should not be construed in limitation thereof.

EXAMPLE I

A pellet heater made from 0.040" (1 mm) diameter tungsten wire was wound with 6½ turns around a mandrel of 0.5" (20 mm) diameter and had a total filament length of 432 mm. A pellet support made from 0.035" (0.875 mm) tungsten wire was wound around a leg of the 0.040" diameter tungsten wire, outside of such turns, and attached thereto by means of a platinum weld. An annular pellet weighing 0.838 grams of silicon monoxide material, SiO, was mounted on the support arm on an annular washer, which surmounted a minor coil spacer of tungsten wire so as to support the pellet within the heated coil, e.g., as shown in FIG. 2.

An annular heat shield of refractory metal was lowered over the pellet and heater coil, e.g., as indicated in FIG. 1 and the assembly was mounted in a bell jar vacuum coater which was then evacuated to $10^{-5}$ torr. Then electrical power, 18 volts at 50 amps., was applied to the heater coil.

The pellet completely evaporated in 9 minutes. A crystal monitor located 21 cm directly above the evaporator assembly indicated a deposition rate of 9.4 A°/sec.

After 10 runs of the above procedure, no erosion or chemical attack of the heater coil was visible.

Accordingly the evaporation heater embodying the invention is highly effective in evaporating evaporant material, with relatively low power requirements and employing a low-cost, highly durable structure.

While there have been shown and described what are at present considered the preferred embodiments of the invention, it will be obvious to those skilled in the art that various changes and modifications may be made therein without departing from the scope of the invention as defined by the appended claims.

We claim:

1. An apparatus for heating evaporant material comprising, a conductive annular heating element having a plurality of conductors mounted thereto, and a material holder including a support arm mounted to one of said conductors outside of said annular heating element, which arm extends proximate the interior of said annular heating element, said material holder mounted on said apparatus for holdding said material in spaced proximity with the interior of said heating element so that energization of said heating element by the application of electric current therethrough is operative to radiantly heat said material.

2. The apparatus of claim 1 wherein said heating element is an annular metal body.

3. The apparatus of claim 1 wherein said heating element is a coil of wire.

4. The apparatus of claim 3 wherein said support arm extends into said coil in spaced proximity therewith.

5. The apparatus of claim 3 wherein said support arm extends coaxially into said coil.

6. The apparatus of claim 4 wherein said support arm is a wire which extends around at least a portion of said coil and then extends into said coil.

7. The apparatus of claim 3, 5 or 6, wherein said support arm has mounted thereon a spacer for holding said material at a desired position relative to said coil.

8. The apparatus of claim 7 wherein said support arm has an annular member mounted therearound between said spacer and said material.

9. The apparatus of claim 7 wherein said material is in the form of an annular pellet which is mounted on said support arm proximate the interior of said coil.

10. The apparatus of claim 7 wherein an apertured container is mounted on said support arm proximate the interior of said coil, said container being sized to hold said material therein.

11. The apparatus of claim 10 wherein said apertured container fits over said support arm and on said spacer in spaced proximity with the interior of said coil.

12. The apparatus of claim 3 or 6 wherein said coil and said support arm are both made of tungsten.

* * * * *